(12) United States Patent
Millward et al.

(10) Patent No.: US 8,507,191 B2
(45) Date of Patent: Aug. 13, 2013

(54) METHODS OF FORMING A PATTERNED, SILICON-ENRICHED DEVELOPABLE ANTIREFLECTIVE MATERIAL AND SEMICONDUCTOR DEVICE STRUCTURES INCLUDING THE SAME

(75) Inventors: Dan B. Millward, Boise, ID (US); Yuan He, Boise, ID (US); Lijing Gou, Boise, ID (US); Zishu Zhang, Boise, ID (US); Anton J. deVilliers, Boise, ID (US); Jianming Zhou, Boise, ID (US); Kaveri Jain, Boise, ID (US); Scott Light, Boise, ID (US); Michael Hyatt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 12/986,806

(22) Filed: Jan. 7, 2011

(65) Prior Publication Data

US 2012/0177891 A1 Jul. 12, 2012

(51) Int. Cl.
*G03F 7/26* (2006.01)

(52) U.S. Cl.
USPC .......................................... 430/323; 430/950

(58) Field of Classification Search
USPC .......................................... 430/311, 313, 950
See application file for complete search history.

(56) References Cited

U.S. PATENT DOCUMENTS

| | | | |
|---|---|---|---|
| 4,504,574 A | 3/1985 | Meyer et al. |
| 4,910,122 A | 3/1990 | Arnold et al. |
| 5,362,666 A | 11/1994 | Dennison |
| 5,635,333 A | 6/1997 | Petersen et al. |
| 5,968,324 A | 10/1999 | Cheung et al. |
| 6,030,541 A | 2/2000 | Adkisson et al. |
| 6,165,684 A | 12/2000 | Mizutani et al. |
| 6,319,651 B1 | 11/2001 | Holmes et al. |
| 6,365,509 B1 | 4/2002 | Subramanian et al. |
| 6,653,735 B1 | 11/2003 | Yang et al. |
| 6,844,131 B2 | 1/2005 | Oberlander et al. |
| 6,872,506 B2 | 3/2005 | Neef et al. |
| 6,900,134 B1 | 5/2005 | Shih et al. |
| 7,270,933 B2 | 9/2007 | Jung |
| 7,341,939 B2 | 3/2008 | Oweyang et al. |
| 7,371,485 B2 | 5/2008 | Brooks et al. |

(Continued)

FOREIGN PATENT DOCUMENTS

KR 10-2009-0067092 6/2009

OTHER PUBLICATIONS

Houlihan et al., Second Generation Radiation Sensitive 193 nm Developable Bottom Anti Reflective Coatings (DBARC): Recent Results, Proc. of SPIE (2008), vol. 6923, pp. 692330-1-692330-7.

*Primary Examiner* — Kathleen Duda
(74) *Attorney, Agent, or Firm* — TraskBritt

(57) ABSTRACT

Methods of forming a patterned, silicon-enriched developable antireflective material. One such method comprises forming a silicon-enriched developable antireflective composition. The silicon-enriched developable antireflective composition comprises a silicon-enriched polymer and a crosslinking agent. The silicon-enriched polymer and the crosslinking agent are reacted to form a silicon-enriched developable antireflective material that is insoluble and has at least one acid-sensitive moiety. A positive-tone photosensitive material, such as a positive-tone photoresist, is formed over the silicon-enriched developable antireflective material and regions thereof are exposed to radiation. The exposed regions of the positive-tone photosensitive material and underlying regions of the silicon-enriched developable antireflective material are removed. Additional methods are disclosed, as are semiconductor device structures including a silicon-enriched developable antireflective material.

31 Claims, 11 Drawing Sheets

(56) References Cited

U.S. PATENT DOCUMENTS

| | | |
|---|---|---|
| 7,655,389 B2 | 2/2010 | Yoon |
| 7,666,794 B2 | 2/2010 | Lin |
| 8,313,889 B2 * | 11/2012 | Yu et al. .................. 430/313 |
| 2004/0018451 A1 | 1/2004 | Choi |
| 2005/0171277 A1 | 8/2005 | Li et al. |
| 2006/0063105 A1 | 3/2006 | Oberlander et al. |
| 2007/0015082 A1 | 1/2007 | Angelopoulos et al. |
| 2007/0128886 A1 | 6/2007 | Ogihara et al. |
| 2007/0184648 A1 | 8/2007 | Yoon et al. |
| 2007/0243484 A1 | 10/2007 | Chen et al. |
| 2008/0171269 A1 | 7/2008 | Dunn |
| 2009/0104559 A1 | 4/2009 | Houlihan et al. |
| 2009/0243018 A1 | 10/2009 | Karkkainen |
| 2009/0246958 A1 | 10/2009 | Burns et al. |
| 2009/0291392 A1 | 11/2009 | Chen et al. |
| 2010/0093969 A1 * | 4/2010 | Zhang et al. .................. 528/20 |

* cited by examiner

METHODS OF FORMING A PATTERNED, SILICON-ENRICHED DEVELOPABLE ANTIREFLECTIVE MATERIAL AND SEMICONDUCTOR DEVICE STRUCTURES INCLUDING THE SAME

TECHNICAL FIELD

Embodiments of the present disclosure relate to methods of forming a patterned, antireflective material such as one that exhibits enhanced etch resistance. More specifically, certain embodiments of the present disclosure relate to methods of forming a patterned, silicon-enriched, developable antireflective material.

BACKGROUND

Reducing semiconductor device feature geometries plays a vital role in reducing the size and increasing the speed of integrated circuits. Therefore, the techniques used to achieve these smaller device feature geometries are continually evolving. Photolithography is one such evolving technique. In a conventional photolithographic process, a photosensitive film, such as a photoresist, is formed on a surface of a substrate. The photoresist is exposed to a source of radiation through an imaging device (i.e., a mask, reticle) to form a pattern thereon. Exposed regions of the photoresist undergo a transformation, whereby subsequent development forms a topographic pattern in the photoresist; some regions of the photoresist remain and some are removed. In areas where the photoresist has been removed, additional processing may transfer the pattern to the substrate surface. Conversely, in areas where the photoresist remains, the photoresist serves to protect the underlying substrate during the additional processing.

Advances in photolithography have lead to the development of high resolution, deep ultraviolet (100 nm-300 nm) or extreme ultraviolet positive-tone and negative-tone photoresists that may be used to pattern images with less than quarter micron geometries. However, the use of deep ultraviolet wavelengths of radiation during the photolithographic process may cause increased reflection from the surface of the underlying substrate. Reflected radiation may in turn cause major problems, such as thin film interference effects and reflective notching. Several techniques have been developed to mitigate the back reflection of the radiation used to activate the photoresist. One such technique is the use of a bottom antireflective coating (BARC). A BARC is a radiation-absorbing layer that is interposed between the photoresist and the substrate surface. BARCs may be composed of either organic or inorganic materials. Although BARCs may reduce the amount of reflected radiation, the use of BARCs in the photolithographic process adds additional acts to the photolithography process, such as additional deposition and etching acts. While etching may effectively remove the BARC, the etching conditions may also detrimentally affect at least one of the overlying photoresist and the substrate surface. For example, the etching may cause variances in critical dimensions due to the fact that the photoresist is not entirely resistant to the etching conditions.

One proposed solution to the BARC removal problem has been the use of developable bottom antireflective coatings (dBARCS). The difference between a dBARC and a BARC is that the dBARC may become soluble in a developer and, therefore, may be removed during the photoresist development. The use of a dBARC may reduce the total number of process acts while avoiding the damage caused by etching.

One problem with conventional dBARC technology is the use of plasma etching in the subsequent patterning of the substrate material below the patterned dBARC. During this plasma etching, the dBARC effectively serves as a mask to enable the selective removal of portions of the substrate material. However, plasma etching of the substrate material may overetch or imprecisely etch the sidewalls of the patterns (e.g., openings) formed in the dBARC. In addition, excess sidewall removal of the dBARC material results in the loss of critical dimensions of patterned dBARC features, which may, in turn, cause the loss of critical dimensions of patterned resist features and of features formed in the substrate material.

In view of this problem, there remains a need for forming and patterning a developable antireflective material, such as one that exhibits enhanced etch resistance over conventional developable bottom antireflective coatings.

DETAILED DESCRIPTION

Figure 1A:
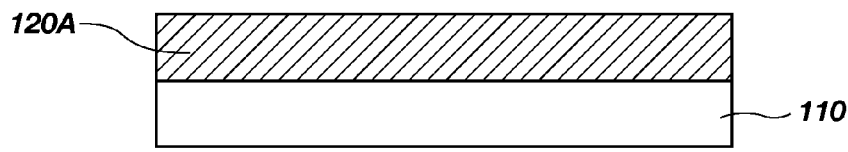
FIGS. 1A-1G are cross-sectional views of semiconductor device structures that illustrate the processing acts that may be employed in embodiments of the present disclosure to form a patterned, silicon-enriched, developable antireflective material on a substrate.

The present disclosure is directed to a silicon-enriched developable antireflective material, such as a silicon-enriched developable bottom antireflective material, and methods of using the silicon-enriched developable antireflective material. The silicon-enriched developable antireflective material may be produced by crosslinking a silicon-enriched developable antireflective composition. The solubility of the silicon-enriched developable antireflective material may be changed, i.e., from soluble to insoluble, or insoluble to soluble, by exposing the silicon-enriched developable antireflective material to different conditions. For instance, the solubility of the silicon-enriched developable antireflective material in a solvent, such as an aqueous alkaline solution or other solvent, may be changed by exposing the silicon-enriched developable antireflective material to at least one of heat and radiation. The silicon-enriched developable antireflective composition may include at least one acid generator that generates acid to crosslink a silicon-enriched polymer therein or to hydrolyze or decouple a crosslinked silicon-enriched polymer. The acid used to crosslink the silicon-enriched polymer may be a weaker acid than the acid used to decouple the crosslinked silicon-enriched polymer. By changing the solubility of the silicon-enriched developable antireflective material, the silicon-enriched developable antireflective material may be utilized in double patterning processes, which utilize a photosensitive material, such as a positive-tone photoresist. Depending on the pattern to be formed, the photosensitive material may be exposed and developed using a positive-tone develop or a negative-tone develop.

The following description provides specific details, such as material types, material thicknesses, and processing conditions in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form the complete semiconductor device from the intermediate semiconductor device structures may be performed by conventional fabrication techniques. Also note, any drawings accompanying the present application are for illustrative purposes only, and are thus not drawn to scale. Additionally, elements common between figures may retain the same numerical designation.

One embodiment of the present disclosure will now be described with reference to FIGS. 1A-1G, which illustrate semiconductor device structures that may be formed in the process of patterning the silicon-enriched developable antireflective material. The silicon-enriched developable antireflective material may be formed over a material, such as a substrate, and crosslinked, using a weak acid, to form a silicon-enriched developable antireflective material. As used herein, the term "crosslinking" refers to a process in which more than one molecule, or more than one portion of a long molecule, are joined together by a chemical interaction. Such chemical interactions may include the formation of bonds (e.g., covalent, hydrogen), hydrophobic interactions, hydrophilic interactions, ionic interactions, or electrostatic interactions. Thus, the silicon-enriched developable antireflective material is produced after crosslinking the silicon-enriched developable antireflective composition. Before crosslinking, the silicon-enriched developable antireflective composition may be soluble in a first solvent, such as an aqueous alkaline solution or other solvent. As used herein, the term "solvent" means and includes water, an aqueous solution, or an organic solvent. However, after crosslinking, the silicon-enriched developable antireflective material may become insoluble. A positive-tone photoresist may be formed over the silicon-enriched developable antireflective material. Regions of the positive-tone photoresist may be exposed to radiation through an imaging device (e.g., mask or reticle). The exposed regions of the positive-tone photoresist and underlying regions of the silicon-enriched developable antireflective material may be selectively removed using the first and second solvents, producing a pattern in the positive-tone photoresist and the silicon-enriched developable antireflective material. To enable the solubility of the underlying silicon-enriched developable antireflective material regions to change, the silicon-enriched developable antireflective composition, before crosslinking, may include a crosslinking agent that reacts with a crosslinkable polymer when activated by a weak acid formed by heat and/or radiation. Following crosslinking, the crosslinked moiety of the silicon-enriched developable antireflective material may be decoupled (e.g., decomposed or hydrolyzed) when exposed to a decoupling agent, such as a strong acid.

Referring to FIG. 1A, a silicon-enriched developable antireflective composition 120A may be formed on an upper surface of a material, such as substrate 110. Any suitable method to apply the silicon-enriched developable antireflective composition 120A on the substrate 110 may be employed. Suitable methods of applying the silicon-enriched developable antireflective composition 120A may, for example, include spin coating, spray coating, dip coating, roller coating, brush coating, extrusion coating, curtain coating, immersion coating, offset printing, screen printing, evaporation, and chemical solution deposition. The substrate 110 may be a conventional silicon substrate or other bulk substrate having a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The substrate 110 may also be an insulating material, a conductive material, or any combination thereof.

The silicon-enriched developable antireflective composition 120A, before crosslinking, may include at least a silicon-enriched polymer, a crosslinking agent, a casting solvent, an acid generator, and, in one or more embodiments, a dye or other desired additives (e.g., a diffusion control agent, a surfactant). The silicon-enriched polymer used in the silicon-enriched developable antireflective composition 120A may include an organo-silicate compound, an organo-siloxane compound, or an organo-silsesquioxane compound that is soluble in the solvent or that may be modified with at least one moiety to become soluble in the solvent. The silicon-enriched polymer may include a silicon content of at least about 17% by weight of a total weight of the silicon-enriched polymer. The silicon-enriched polymer may additionally include at least one moiety that may react with the crosslinking agent in the silicon-enriched developable antireflective composition 120A. Non-limiting examples of such moieties include, but are not limited to, hydroxyl moieties, sulfhydryl moieties, epoxide moieties, carboxylic acid moieties, isocyanate moieties, or amino moieties. In one embodiment, the silicon-enriched polymer is a modified poly(dimethylsiloxane) (PDMS). PDMS is a water-insoluble, polymeric organo-siloxane compound with a silicon content of at least about 17% by weight. The PDMS may be modified by grafting at least two hydroxyl-terminated oligo(ethylene oxide) moieties onto the PDMS to produce PDMS-g-PEO-OH, which is water soluble and may react with the crosslinking agent. Water-soluble, PDMS derivatives, such as PDMS-g-PEO-OH, may be commercially available, such as from Gelest, Inc., Morrisville, Pa. In another embodiment, the silicon-enriched polymer is soluble in a non-aqueous solvent.

The crosslinking agent in the silicon-enriched developable antireflective composition 120A may be a compound that includes at least one moiety that, in the presence of at least one of heat and acid, reacts with the aforementioned moieties of the silicon-enriched polymer to form a silicon-enriched polymer that includes at least one acid-sensitive moiety, as described in more detail below. After crosslinking, the silicon-enriched polymer is insoluble in the solvent. If the crosslinking agent was not present in the silicon-enriched developable antireflective composition 120A, the silicon-enriched developable antireflective composition 120A may become soluble in the aqueous alkaline solution upon exposure to heat. By subsequent acid hydrolysis of the acid-sensitive moiety, the affected regions in the insoluble, silicon-enriched polymer may be converted from insoluble to soluble in the solvent, along with additional reaction products. Suitable crosslinking agents may, for example, include vinyl ether derivatives or bis(allyl)ether derivatives.

The acid generator in the silicon-enriched developable antireflective composition 120A may be used to assist in the crosslinking of the silicon-enriched polymer and decoupling of the crosslinked silicon-enriched polymer. The acid produced by the acid generator may be used to catalyze the crosslinking of the silicon-enriched polymer and the crosslinking agent, or to hydrolyze the silicon-enriched developable antireflective material 120B. The acid generator in the silicon-enriched developable antireflective composition 120A may be a thermal acid generator (hereinafter referred to as a "TAG"), a photoacid generator (hereinafter referred to as a "PAG," or combinations thereof. Silicon-enriched developable antireflective material includes both a TAG and a PAG. The TAG may be a conventional TAG known in the photoresist art that is compatible with the other components of the silicon-enriched developable antireflective composition 120A. The acid generated by the TAG may be a weaker acid (higher pKa) than the acid generated by a photoacid generator (PAG) in a photosensitive composition used in the process of patterning the silicon-enriched developable antireflective material, as described below. Examples of TAGs that may be used include alkyl ester compounds, sulfonic ester compounds, organic sulfonic acid compounds, blocked alkyl phosphoric acid compounds, blocked perfluoralkyl sulfonic acid compounds, alkyl phosphoric acid/amine complexes, amine compounds, quaternary ammonium compounds, or combinations thereof. The TAG may be present in the silicon-enriched developable antireflective composition 120A at an amount of from about 1% by weight of the silicon-enriched polymer to about 10% by weight of the silicon-enriched polymer.

The silicon-enriched developable antireflective composition 120A may, in at least some embodiments, also include a diffusion control agent to limit horizontal and/or vertical diffusion of the acid generated by the acid generator. The diffusion control agent may be a compound that prevents the attack and cleavage of the acid-sensitive moieties by protonation. The amount of diffusion control agent in the silicon-enriched developable antireflective composition 120A may be lower than the amount of acid generator. Therefore, the diffusion control agent, if present, may be present in a range of from about 3% by weight to about 50% by weight of the acid generator, but the amount may also be adjusted to account for external influences (e.g., acid from a different source). Diffusion control agents are known to those of ordinary skill in the art and include, but are not limited to, nitrogenous bases and base generators.

The silicon-enriched developable antireflective composition 120A may, in at least some embodiments, also include a dye that absorbs radiation of a particular wavelength (e.g., 248 nm, 193 nm, 157 nm, 126 nm, 13 nm). Such dyes are known to those of ordinary skill in the art and may be monomeric, polymeric, or combinations thereof. When present, the dye may at least partially effectuate the anti-reflective properties of the silicon-enriched developable antireflective composition 120A. By way of example, the silicon-enriched developable antireflective composition 120A may include a water-soluble, silicon-enriched polymer that includes at least one chromophore functional group that absorbs radiation of the particular wavelength. The anti-reflective properties of the silicon-enriched developable antireflective composition 120A may also be at least partially determined by the oxygen content of the water-soluble silicon-enriched polymer. The anti-reflective properties of the silicon-enriched developable antireflective composition 120A may be characterized in terms of the index of refraction (n), extinction coefficient (k), and thickness. At least with respect to the 193 nm wavelength of radiation, the index of refraction (n) may be within a range of from about 1.5 to about 1.8, and the extinction coefficient (k) may be within a range of from about 0.17 to about 0.3.

The casting solvent may be selected by one of ordinary skill in the art depending on the components of the silicon-enriched developable antireflective composition 120A. The components of the silicon-enriched developable antireflective composition 120A may be combined, such as by mixing, to produce the silicon-enriched developable antireflective composition 120A.

Figure 1B:
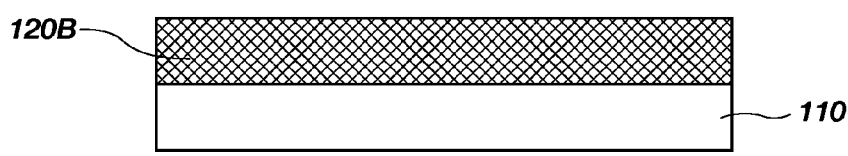

Referring next to FIG. 1B, after the silicon-enriched developable antireflective composition 120A is formed on the substrate 110, the silicon-enriched developable antireflective composition 120A may undergo a crosslinking reaction to form a silicon-enriched developable antireflective material 120B that is insoluble in the solvent and sensitive to a strong acid. The crosslinking may be initiated by exposing the silicon-enriched developable antireflective composition 120A to heat, which is commonly referred to as a so-called "bake." The heat may activate a weak acid generator, such as the TAG, in the silicon-enriched developable antireflective composition 120A, crosslinking the silicon-enriched polymer of the silicon-enriched developable antireflective composition 120A. The crosslinking of the silicon-enriched developable antireflective composition 120A may increase the molecular weight of the silicon-enriched polymer, rendering the polymer insoluble in the solvent. The silicon-enriched developable antireflective composition 120A may be heated to a temperature sufficient to initiate the crosslinking of the silicon-enriched polymer. By way of example, to crosslink the silicon-enriched polymer, the silicon-enriched developable antireflective composition 120A on the substrate 110 may be heated to a temperature of from about 20° C. to about 250° C. The acid generated by the TAG may protonate the acid-sensitive moieties on the crosslinking agent, forming a compound with moieties that in turn react with the moieties of the silicon-enriched polymer to form the silicon-enriched developable antireflective material 120B. By way of example, if a silicon-enriched developable antireflective composition 120A including PDMS-g-PEO-OH, a vinyl ether crosslinking agent, and a TAG is heated, the crosslinking reaction may result in the production of a thermally generated acid that protonates the vinyl ether to create a strong electrophilic functional group. This strong electrophilic functional group may then react with the hydroxyl functional group on the PDMS-g-PEO-OH to form the silicon-enriched developable antireflective material 120B, which is insoluble in the solvent and contains functional groups that are sensitive to acid hydrolysis. Following the crosslinking reaction, the silicon content of the crosslinked silicon-enriched polymer may be within the range of at least about 17% by weight of the silicon-enriched developable antireflective material 120B.

The silicon-enriched developable antireflective composition 120A may be heated for an amount of time sufficient for the crosslinking to occur. By way of example, the silicon-enriched developable antireflective composition 120A may be heated for an amount of time ranging from about 5 seconds to about 3 hours. The heating of the silicon-enriched developable antireflective composition 120A may occur at a single temperature or may include exposure to multiple, stepwise temperature increases. The substrate 110A having the silicon-enriched developable antireflective composition 120A thereon may be heated on a hot plate or in an oven, as known in the art. The oven may, for example, include an oven with thermal heating in air or in an inert atmosphere, a vacuum oven with thermal heating, or an infrared oven. The exposure time and temperature employed may be selected based on the components used in the silicon-enriched developable antireflective composition 120A.

The thickness of the silicon-enriched developable antireflective material 120B may vary depending on the technique used to apply the silicon-enriched developable antireflective composition 120A to the substrate 110 and the components used in the silicon-enriched developable antireflective composition 120A. One of ordinary skill in the art will recognize that the thickness of the silicon-enriched developable antireflective material 120B may be modified so long as the thickness is sufficient to enable the photolithographic patterning of a photosensitive material and adequately protect underlying regions of the substrate 110 during subsequent treatment of the substrate 110 (e.g., plasma etching).

Figure 1C:
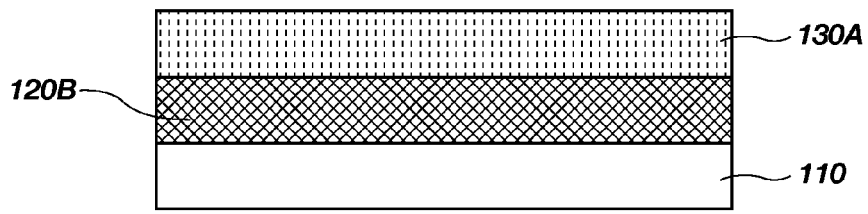

Referring to FIG. 1C, a positive-tone photoresist composition 130A may be formed over the upper surface of the silicon-enriched developable antireflective material 120B. As used herein, the term "positive-tone photoresist" means and includes a photoresist in which regions exposed to ultraviolet light and a post-exposure bake become soluble in an aqueous alkaline solution, such as TMAH, and insoluble in a negative-tone develop (NTD) solvent. Regions of the positive-tone photoresist that are not exposed to ultraviolet light are soluble in the NTD solvent. As used herein, the term "NTD solvent" means and includes a solvent in which regions of the positive-tone resist that are exposed to ultraviolet light are not soluble. By way of example, the NTD solvent may be n-butyl acetate. The positive-tone photoresist composition 130A may be applied over the upper surface of the silicon-enriched developable antireflective material 120B by spin coating, spray coating, dip coating, roller coating, brush coating, extrusion coating, curtain coating, immersion coating, offset printing, screen printing, evaporation, chemical solution deposition, or other conventional techniques. The positive-tone photoresist composition 130A may include a silicon-enriched polymer, a non-silicon-enriched polymer, or a combination thereof. The positive-tone photoresist composition 130A may also include an acid generator (e.g., a TAG and/or a PAG), a casting solvent, and other desired additives (e.g., diffusion control agent).

Suitable polymers for use in the positive-tone photoresist composition 130A are known in the art and may include, but are not limited to, phenol-formaldehyde derivatives (e.g., Novolak polymers), methacrylates, acrylates, or polyhydroxy styrene (PHS). The positive-tone photoresist composition 130A may be a conventional positive-tone photoresist and, therefore, its components are not described in detail herein. By way of example, the positive-tone photoresist composition 130A may be SAIL-X181 from Shin-Etsu Chemical Co., Tokyo, Japan, EPIC™-2013 from Dow Chemical Co., Midland, Mich., a polyhydroxystyrene-based resist, or a polyacrylate-based resist. The TAG may be one of the compounds previously described in reference to the silicon-enriched developable antireflective composition 120A. The PAG in the positive-tone photoresist composition 130A may be a conventional PAG known in the photoresist art that is sensitive to the desired wavelength of radiation (e.g., 248 nm, 193 nm, 157 nm, 126 nm, 13 nm) and that is compatible with the other components of the positive-tone photoresist composition 130A. The PAG to be included in the positive-tone photoresist composition 130A may include an onium salt (such as a sulfonium salt), iodonium salt, a nitrobenzyl-sulfonate ester compound, an oximesulfonate compound, an imidosulfonate compound, or a disulfonate compound. The PAG included in the positive-tone photoresist composition 130A may be sensitive to the same wavelength of radiation as the PAG in the silicon-enriched developable antireflective composition 120A. Alternatively, the PAG included in the positive-tone photoresist composition 130A may be sensitive to a different wavelength of radiation than the PAG in the silicon-enriched developable antireflective composition 120A, in one or more embodiments where PAG is present in the silicon-enriched developable antireflective composition 120A. The acid generated by the PAG may be a stronger acid (lower pKa) than the acid generated by the TAG in the silicon-enriched developable antireflective composition 120A. The acid generator in the positive-tone photoresist composition 130A may be used to assist in the acid hydrolysis of the silicon-enriched polymer.

A suitable casting solvent for the positive-tone photoresist composition 130A may be a solvent that is inert, dissolves the components of the positive-tone photoresist composition 130A, does not dissolve the underlying silicon-enriched developable antireflective material 120B, and is removable by exposure to heat. The casting solvent may be selected by one of ordinary skill in the art depending on the components of the positive-tone photoresist composition 130A.

Figure 1D:
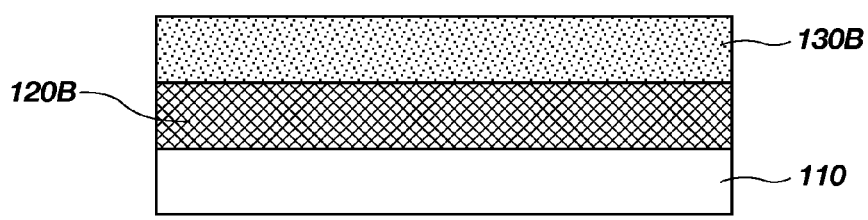

Referring next to FIG. 1D, after applying the positive-tone photoresist composition 130A over the upper surface of the silicon-enriched developable antireflective material 120B, the positive-tone photoresist composition 130A may be heated to remove the casting solvent and form a positive-tone photoresist material 130B. The heating of the positive-tone photoresist composition 130A is commonly referred to as a so-called "soft bake." The positive-tone photoresist composition 130A may be heated to a single temperature or by exposure to multiple, stepwise temperature increases. Heating of the substrate 110 including the silicon-enriched developable antireflective material 120B and the positive-tone photoresist material 130B may occur on a hot plate or in an oven, as described above. The amount of time and temperature to which the positive-tone photoresist composition 130A is heated may depend on the components of the positive-tone photoresist composition 130A, and may range from about 20° C. to about 250° C., with bake durations that may range from about 5 seconds to about 10 hours.

Figure 1E:
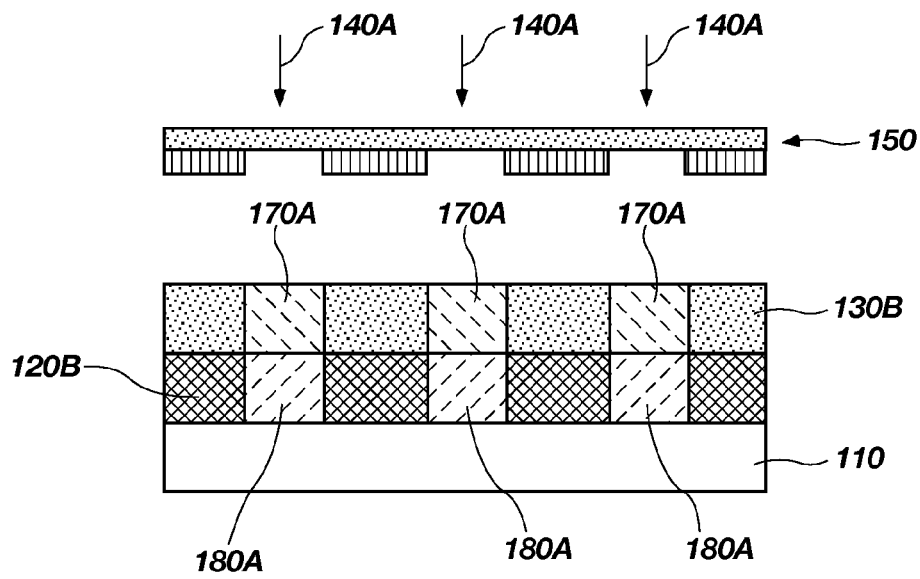

Referring to FIG. 1E, the positive-tone photoresist material 130B may be exposed to radiation 140A having a wavelength of less than or equal to about 248 nm (e.g., 248 nm, 193 nm, 157 nm, 126 nm, 13 nm) to pattern the positive-tone photoresist material 130B. The positive-tone photoresist material 130B may be exposed to the radiation 140A through a mask 150 having a predetermined pattern thereon, forming photoexposed photoresist regions 170A in the positive-tone photoresist material 130B. The mask 150 having the desired pattern may be formed by conventional techniques, which are not described in detail herein. The positive-tone photoresist material 130B may also be patterned by through direct writing (i.e., without a mask).

Since the positive-tone photoresist material 130B includes a PAG that is sensitive to the radiation 140A being used, the radiation 140A may initiate bleaching (i.e., deprotection) of the positive-tone photoresist material 130B, producing the photoexposed photoresist regions 170A of the positive-tone photoresist material 130B. The acid from the PAG may, in turn, react with the polymer of the positive-tone photoresist 130B such that the photoexposed photoresist regions 170A become more soluble in the aqueous alkaline solution than regions of the positive-tone photoresist 130B that are not exposed to the radiation 140A.

Acid generated by the PAG in the positive-tone photoresist composition 130A may diffuse into the regions of the silicon-enriched developable antireflective material 120B underlying photoexposed photoresist regions 170A, producing underlying silicon-enriched developable antireflective material regions 180A, which are soluble. For example, the acid may react with the acid-sensitive moieties of the crosslinked, silicon-enriched polymer of the silicon-enriched developable antireflective material 120B to hydrolyze and, hence, render soluble in solvent, the underlying silicon-enriched developable antireflective material regions 180A. The diffusion of the acid generated by the PAG in the positive-tone photoresist composition 130A may be controlled by including a diffusion control agent (e.g., base, photobase generator) in at least one of the positive-tone photoresist composition 130A and the silicon-enriched developable antireflective composition 120A, or by limiting the amount of the PAG component in the positive-tone photoresist composition 130A.

Following the photoexposure of the positive-tone photoresist material 130B, the positive-tone photoresist material 130B and the photoexposed photoresist regions 170A may be exposed to heat in a so-called "post-exposure bake" treatment. The post-exposure bake may assist with diffusion of any generated acid, the deprotection of leaving groups of the photoexposed photoresist regions 170A, or the acid hydrolysis of the underlying silicon-enriched developable antireflective material regions 180A. The duration of time and temperature at which the post-exposure bake is conducted may vary depending on the components used in the positive-tone photoresist material 130B and the silicon-enriched developable antireflective material 120B. By way of example, the post-exposure bake may be conducted at a temperature of from about 20° C. up to about 250° C. The duration of time for the post-exposure bake duration may vary accordingly, such as from approximately 5 seconds to approximately 10 hours. The post-exposure bake may take place on a hot plate or in an oven as previously described.

Figure 1F:
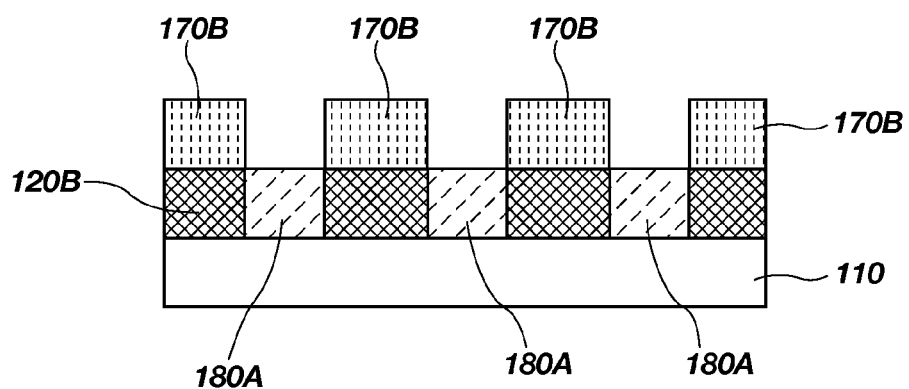
Figure 1G:
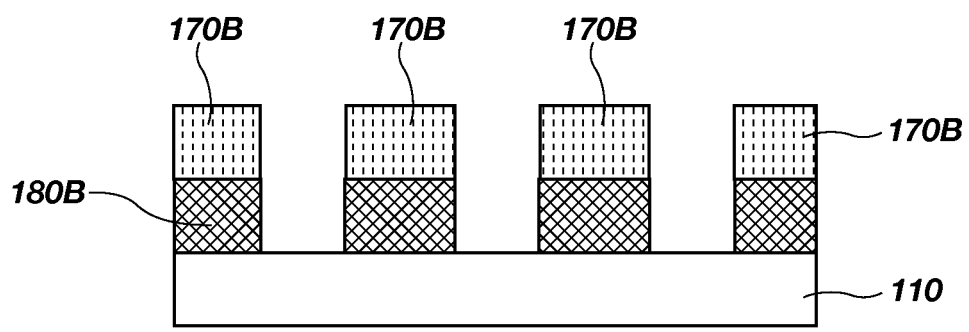

Referring next to FIGS. 1F and 1G, the photoexposed photoresist regions 170A and the underlying silicon-enriched developable antireflective material regions 180A may be removed in one or more acts, forming a positive-tone photoresist pattern 170B and a silicon-enriched developable antireflective material pattern 180B as shown in FIG. 1G. The photoexposed photoresist regions 170A may be removed using the first solvent and the underlying silicon-enriched developable antireflective material regions 180A may be removed using the second solvent. In another embodiment described below in reference to FIGS. 2A-2F, the photoexposed photoresist regions 170A and the underlying silicon-enriched developable antireflective material regions 180A may be sufficiently soluble in the same solvent to be simultaneously removed, fanning the positive-tone photoresist pattern 170B and the silicon-enriched developable antireflective material pattern 180B in a single photolithographic act. Non-limiting examples of solvents, such as aqueous alkaline solutions, that may be used include aqueous solutions of quaternary ammonium salts (e.g., tetramethylammonium hydroxide (TMAH), tetraethylammonium hydroxide, tetrabutylammonium hydroxide), primary amines (e.g., ethylamine, n-propylamine), secondary amines (e.g., diethylamine, di-n-propylamine), tertiary amines (e.g., triethylamine), alcoholamines (e.g., triethanolamine), inorganic alkalis (e.g., potassium hydroxide, sodium hydroxide, ammonia water), and combinations thereof. In one embodiment, the solvent (e.g., aqueous alkaline solution) is TMAH. The aqueous alkaline solution may include from about 1% by weight to about 5% by weight of the quaternary ammonium salt, primary amines, secondary amine, tertiary amine, alcoholamine, or inorganic alkali. The aqueous alkaline solution may also include, in one or more embodiments, additives, such as surfactants, antifoam agents, or salts. The solvent may also be an organic solvent, such as a silicon-containing solvent, such as hexamethyl disiloxane. The positive-tone photoresist pattern 170B may, in one or more embodiments, be removed such that the silicon-enriched developable antireflective material pattern 180B remains on the substrate 110.

By utilizing a silicon-enriched developable antireflective composition 120A including a solvent-soluble silicon-enriched polymer having a silicon content of at least about 17% by weight of the total weight of the silicon-enriched polymer, the silicon-enriched developable antireflective material may be developed in regions exposed to at least one of radiation and heat, enabling selective development and removal of the silicon-enriched developable antireflective material. By crosslinking the solvent-soluble, silicon-enriched polymer in the silicon-enriched developable antireflective composition 120A and subsequently hydrolyzing regions of the silicon-enriched developable antireflective material 120B, the silicon-enriched developable antireflective material may be used in a double patterning process. Remaining regions of the silicon-enriched polymer are insoluble in the solvent and produce a pattern of the silicon-enriched developable antireflective material. Due to the silicon content of the silicon-enriched developable antireflective material, the silicon-enriched developable antireflective material pattern is resistant to etching relative to organic materials, such as, but not limited to, transparent carbon, amorphous carbon, or spin-on carbon.

Figure 2A:
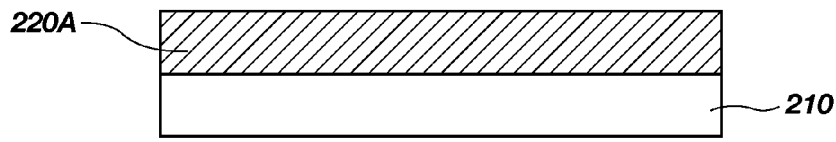
FIGS. 2A-2F are cross-sectional views of semiconductor device structures that illustrate the processing acts that may be employed in embodiments of the present disclosure to form a patterned, silicon-enriched, developable antireflective material on a substrate.

Another embodiment of the present disclosure will now be described with reference to FIGS. 2A-2F, which illustrate semiconductor device structures that may be formed in the process of patterning the silicon-enriched developable antireflective material. The process is substantially the same as that described above in relation of FIGS. 1A and 1B, except that the photoexposed photoresist regions 170A and the underlying silicon-enriched developable antireflective material regions 180A may be removed using a single solvent, such as an aqueous alkaline solution. By utilizing a silicon-enriched polymer in the silicon-enriched developable antireflective composition 120A that is water-soluble rather than solvent-soluble, the photoexposed photoresist regions 170A and the underlying silicon-enriched developable antireflective material regions 180A may be removed using the aqueous alkaline solution. Referring to FIG. 2A, the upper surface of a substrate 210 is coated with a silicon-enriched developable antireflective composition 220A. The silicon-enriched developable antireflective composition 220A may be formed on the substrate 210 as described above. The substrate 210 may be substantially similar to the substrate 110 described above. The silicon-enriched developable antireflective composition 220A may be substantially similar to the silicon-enriched developable antireflective composition 120A described above, with each of the silicon-enriched developable antireflective composition 220A and a positive-tone photoresist composition 230A including a TAG, or a TAG and a PAG. The acid generated by the TAG may be a weaker acid (higher pKa) than the acid generated by the PAG.

Figure 2B:
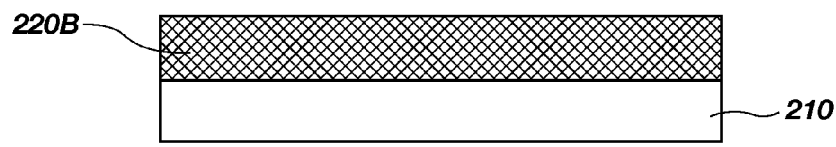
Figure 2C:
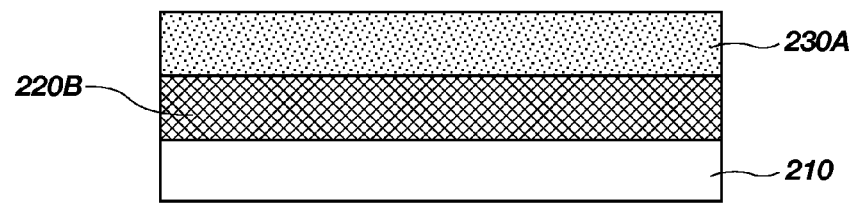

Referring next to FIG. 2B, the silicon-enriched developable antireflective composition 220A may undergo a crosslinking reaction to form a silicon-enriched developable antireflective material 220B that is insoluble and sensitive to a strong acid. The crosslinking reaction to form the silicon-enriched developable antireflective material 220B may be substantially similar to that described above with respect to formation of the silicon-enriched developable antireflective material 120B. The acid generated by the TAG in the silicon-enriched developable antireflective composition 220A may catalyze the crosslinking of the water-soluble, silicon-enriched polymer and the crosslinking agent. Referring to FIG. 2C, the positive-tone photoresist composition 230A may be formed over the upper surface of the silicon-enriched developable antireflective material 220B. The positive-tone photoresist composition 230A may be applied over the upper surface of the silicon-enriched developable antireflective material 220B as previously described. The positive-tone photoresist composition 230A may be substantially similar to the positive-tone photoresist composition 130A described above.

Figure 2D:
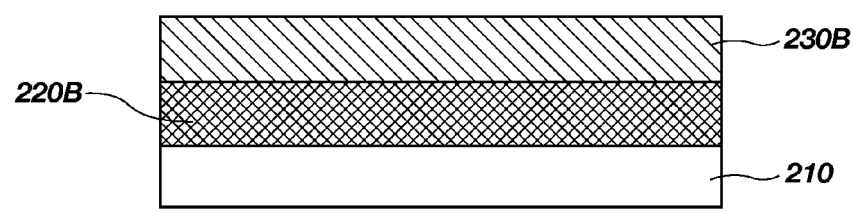
Figure 2E:
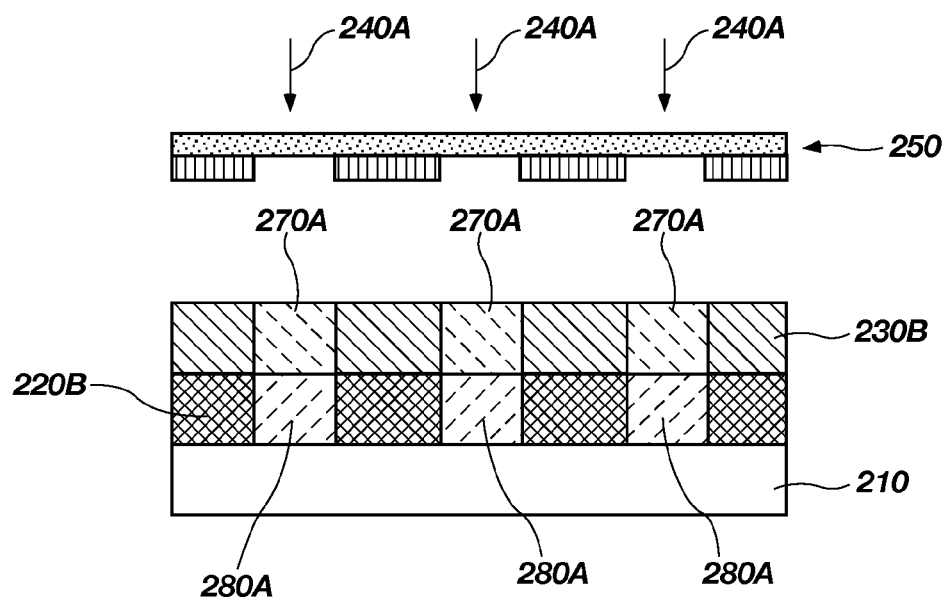

Referring next to FIG. 2D, after applying the positive-tone photoresist composition 230A over the upper surface of the silicon-enriched developable antireflective material 220B, the positive-tone photoresist composition 230A may be heated to remove the casting solvent and form a positive-tone photoresist material 230B. As shown in FIG. 2E, the positive-tone photoresist material 230B may be exposed to radiation 240A and subjected to a post-exposure bake in a manner substantially similar to that described above in regard to FIGS. 1D and 1E. The heating of the positive-tone photoresist material 230B may occur in a manner substantially similar to that disclosed above. Referring to FIG. 2E, the positive-tone photoresist material 230B may be exposed to radiation 240A having a wavelength of less than or equal to about 248 nm (e.g., 248 nm, 193 nm, 157 nm, 126 nm, 13 nm). The positive-tone photoresist material 230B may be exposed to the radiation 240A through a mask 250 having a particular pattern, forming photoexposed photoresist regions 270A in the positive-tone photoresist material 230B. The positive-tone photoresist material 230B may also be patterned by through direct writing (i.e., without a mask).

Since the positive-tone photoresist composition 230A includes a PAG that is sensitive to the radiation 240A being used, the radiation 240A may initiate bleaching (e.g., deprotection) of the positive-tone photoresist material 230B, producing the photoexposed photoresist regions 270A of the positive-tone photoresist material 230B. The strong acid generated by the PAG in the positive-tone photoresist composition 230A may, in turn, react with the polymer of the positive-tone photoresist material 230B such that the photoexposed photoresist regions 270A become more soluble in the solvent than regions of the positive-tone photoresist material 230B that are not exposed to the radiation 240A. Acid generated in the photoexposed photoresist regions 270A may diffuse into the silicon-enriched developable antireflective material 220B in combination with acid generated by the PAG in the silicon-enriched developable antireflective composition 220A, producing underlying silicon-enriched developable antireflective material regions 280A. The acid may react with the acid-sensitive moieties of the polymer of the silicon-enriched developable antireflective material 120B to hydrolyze and, hence, render water-soluble, the underlying silicon-enriched developable antireflective material regions 280A.

Figure 2F:
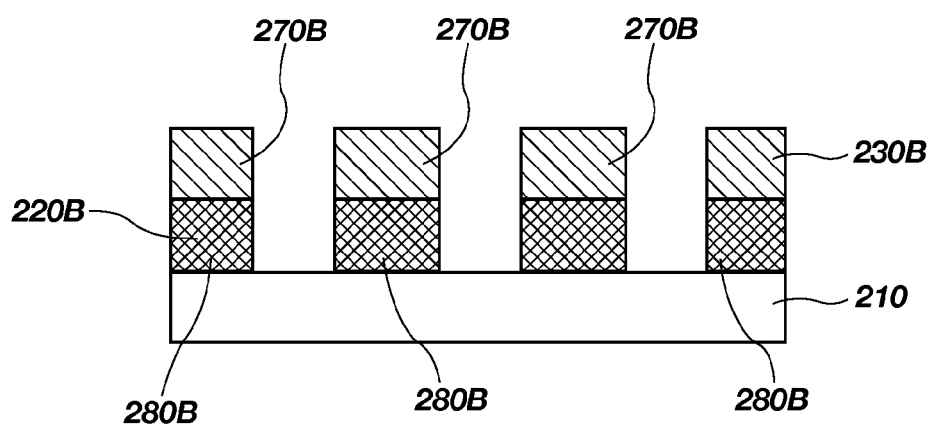

Referring to FIG. 2F, the photoexposed photoresist regions 270A and the underlying silicon-enriched developable antireflective material regions 280A may be removed using the aqueous alkaline solution. The photoexposed photoresist regions 270A and underlying silicon-enriched developable antireflective material regions 280A may be removed using a single solvent that is selective for the photoexposed photoresist regions 270A and underlying silicon-enriched developable antireflective material regions 280A relative to a positive-tone photoresist pattern 270B and the silicon-enriched developable antireflective material 220B. As previously described, acid from the positive-tone photoresist composition 230A may hydrolyze the silicon-enriched developable antireflective material 220B, changing the solubility and forming the underlying soluble silicon-enriched developable antireflective material regions 280A. The positive-tone photoresist material 230B and the silicon-enriched developable antireflective material 220B may be substantially insoluble in the aqueous alkaline solution and remain on the substrate 210, while the photoexposed photoresist regions 270A and the underlying silicon-enriched developable antireflective material regions 280A are soluble and dissolve in the aqueous alkaline solution, such as a solution of TMAH. Removing the photoexposed photoresist regions 270A and the underlying silicon-enriched developable antireflective material regions 280A produces positive-tone photoresist pattern 270B overlying the silicon-enriched developable antireflective material 220B.

The positive-tone photoresist pattern 270B may, in one or more embodiments, be removed (not shown) such that the remaining regions of the silicon-enriched developable antireflective material 220B may produce a silicon-enriched developable antireflective material pattern 280B on the substrate 210. The positive-tone photoresist pattern 270B may be removed using a solvent selective for the positive-tone photoresist pattern 270B. The choice of solvent may be determined by a person of ordinary skill in the art depending on the materials used as the positive-tone photoresist composition 230A and the silicon-enriched developable antireflective composition 220A.

Figure 3A:
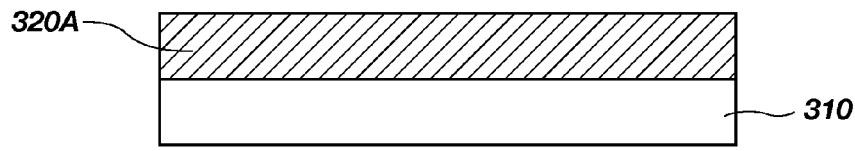
FIGS. 3A-3H are cross-sectional views of semiconductor device structures that illustrate the processing acts that may be employed in embodiments of the present disclosure to form a patterned, silicon-enriched, developable antireflective material on a substrate.

Yet other embodiments of the present disclosure will now be described with reference to FIGS. 3A through 3H, which illustrate additional semiconductor device structures that may be formed in the process of a patterning the silicon-enriched developable antireflective material. A silicon-enriched developable antireflective composition may be formed on a substrate and a positive-tone photoresist formed over the silicon-enriched developable antireflective composition. The silicon-enriched developable antireflective composition may include a PAG and a crosslinking agent that are activated upon exposure to radiation and, optionally, heat. When regions of the positive-tone photoresist are exposed to radiation and heat, underlying regions of the silicon-enriched developable antireflective composition are crosslinked, while the unexposed regions of the positive-tone photoresist and the unexposed regions of the silicon-enriched developable antireflective composition are soluble in, and may be removed by, a solvent. Referring to FIG. 3A, the upper surface of a substrate 310 may be coated with a silicon-enriched developable antireflective composition 320A. The silicon-enriched developable antireflective composition 320A may be formed on the substrate 310 as described above. The substrate 310 and the silicon-enriched developable antireflective composition 320A may be substantially similar to the substrate 110 and the silicon-enriched developable antireflective composition 120A described above. The silicon-enriched developable antireflective composition 320A may include a PAG and a crosslinking agent that are activated upon exposure to radiation and, optionally, heat.

Figure 3B:
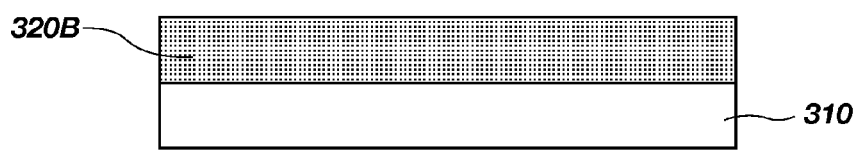

Referring next to FIG. 3B, the silicon-enriched developable antireflective composition 320A may be heated (i.e., soft baked) to remove any casting solvent and form a silicon-enriched developable antireflective material 320B on the substrate 310. The heating may take place on a hot plate or in an oven, as previously described. The heating of the silicon-enriched developable antireflective composition 320A may be conducted at a single temperature or at multiple temperatures. The heating may be conducted for an amount of time and at a temperature sufficient to remove the casting solvent but not initiate crosslinking of the silicon-enriched polymer and the crosslinking agent. The duration of the time and temperature may at least partially depend on the chosen method of heating and the components of the silicon-enriched developable antireflective composition 320A.

Figure 3C:
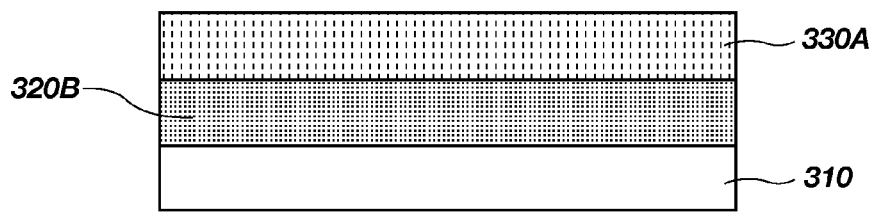
Figure 3D:
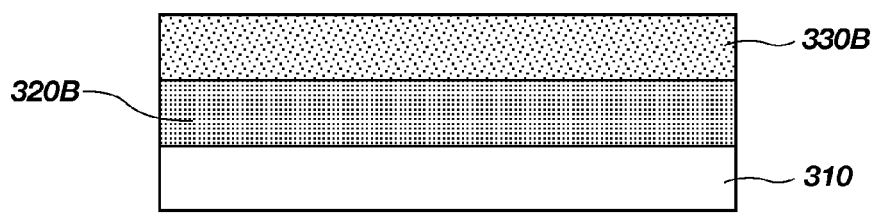

Referring to FIG. 3C, a positive-tone photoresist composition 330A may be formed over the upper surface of the silicon-enriched developable antireflective material 320B. The positive-tone photoresist composition 330A may be formed over the silicon-enriched developable antireflective material 320B before crosslinking the silicon-enriched developable antireflective material 320B. Therefore, in this embodiment, the term "silicon-enriched developable antireflective material" refers to the silicon-enriched developable antireflective composition 320A that is soft baked but not crosslinked. The composition and method of applying the positive-tone photoresist composition 330A may be substantially similar to those previously described with respect to the positive-tone photoresist composition 130A. However, the casting solvent for the positive-tone photoresist composition 330A may be a solvent in which the silicon-enriched developable antireflective material 320B is not soluble (i.e., a non-solvent). By way of example, the casting solvent for the positive-tone photoresist composition 330A may be an alcohol since PDMS is not soluble in an alcohol. Referring next to FIG. 3D, the positive-tone photoresist composition 330A may be heated to remove the casting solvent and form a positive-tone photoresist material 330B. The heating of the positive-tone photoresist composition 330A may occur in a manner substantially similar to that described above for the positive-tone photoresist composition 130A.

Figure 3E:
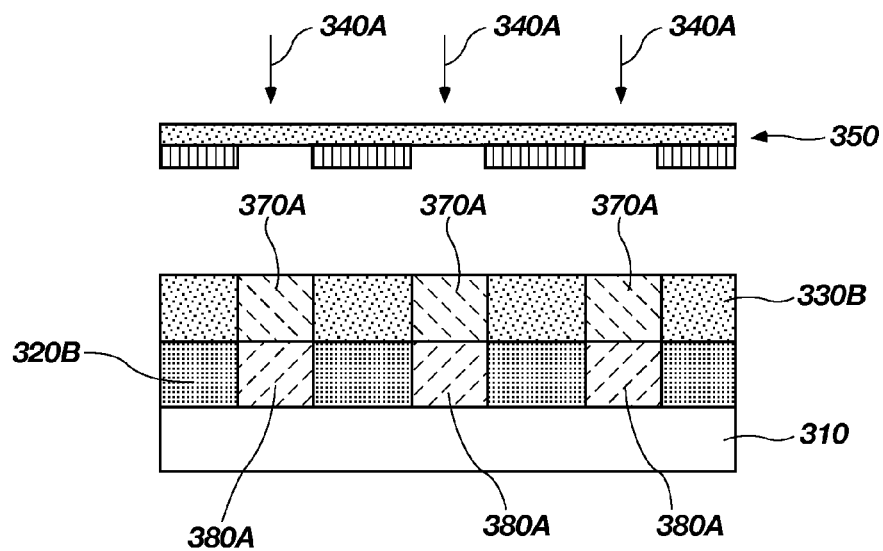

Referring to FIG. 3E, the positive-tone photoresist material 330B may be exposed to radiation 340A and subjected to a post-exposure bake in a manner substantially similar to that described above in regard to FIGS. 1D and 1E. The positive-tone photoresist material 330B may be exposed to radiation 340A having a wavelength of less than or equal to about 248 nm (e.g., 248 nm, 193 nm, 157 nm, 126 nm, 13 nm), producing photoexposed photoresist regions 370A and remaining regions of the positive-tone photoresist material 330B that are not exposed to the radiation 340A. The positive-tone photoresist material 330B may be exposed to the radiation 340A through a mask 350, which is substantially similar to that disclosed above as mask 150. The exposure of the positive-tone photoresist material 330B may also be accomplished in through direct writing (i.e., without a mask).

The PAG in the positive-tone photoresist composition 330A and the PAG in the silicon-enriched developable antireflective composition 320A may be converted by the radiation 340A into acids. The acids may, in turn, react with the polymer of the positive-tone photoresist composition 330A such that the photoexposed photoresist regions 370A are soluble in a first solvent while the remaining regions of the positive-tone photoresist material 330B are not soluble in the first solvent but are soluble in a different, second solvent. The acid generated in the photoexposed photoresist regions 370A may diffuse into underlying silicon-enriched developable antireflective material regions 380A of the silicon-enriched developable antireflective material 320B and crosslink these regions of the silicon-enriched developable antireflective material 320B, as shown in FIG. 3E. Diffusion of acid generated in the photoexposed photoresist regions 370A may be controlled by including a diffusion control agent (e.g., base, photobase generator) in at least one of the positive-tone photoresist material 330B and the silicon-enriched developable antireflective material 320B. Due to the crosslinking, the solubility of the underlying silicon-enriched developable antireflective material regions 380A may be different than the solubility of the remaining regions of the silicon-enriched developable antireflective material 320B, which are not crosslinked.

Figure 3F:
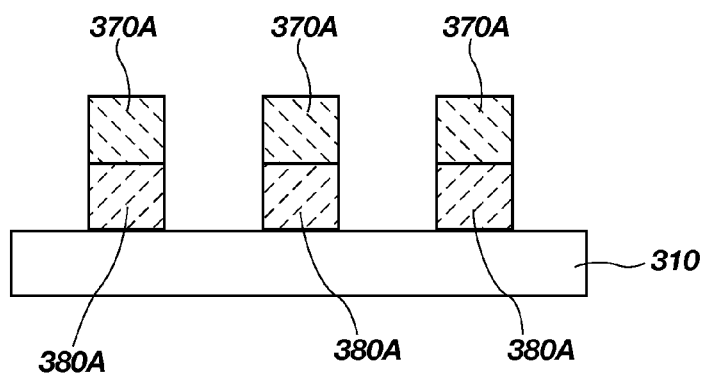
Figure 3G:
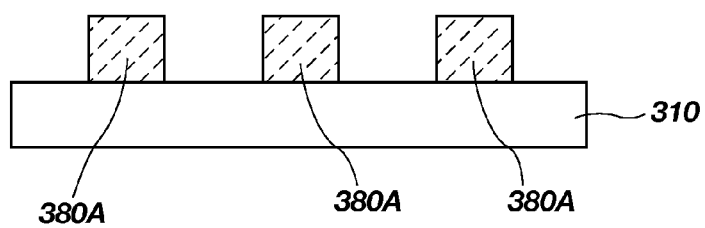

Referring to FIG. 3F, the unexposed regions of positive-tone photoresist material 330B and the non-crosslinked regions of silicon-enriched developable antireflective material 320B may be removed using the second solvent, which is selective for the positive-tone photoresist material 330B and the silicon-enriched developable antireflective material 320B relative to the photoexposed photoresist regions 370A and the underlying silicon-enriched developable antireflective material regions 380A, which are crosslinked. Thus, the photoexposed photoresist regions 370A and the crosslinked, underlying silicon-enriched developable antireflective material regions 380A may remain on the substrate 310. The second solvent used to remove the non-exposed regions of positive-tone photoresist material 330B and the non-crosslinked regions of silicon-enriched developable antireflective material 320B may be a single solvent, such as a NTD solvent, that is configured to simultaneously remove the non-exposed regions of positive-tone photoresist material 330B and the non-crosslinked regions of silicon-enriched developable antireflective material 320B. The non-exposed positive-tone photoresist material 330B and the non-crosslinked silicon-enriched developable antireflective material 320B may also be removed using a solvent system that includes two solvents, one solvent to remove the non-exposed photoresist material 330B and another solvent to remove the non-crosslinked silicon-enriched developable antireflective material 320B. The choice of first solvent and second solvent may be determined by a person of ordinary skill in the art depending on the materials used as the positive-tone photoresist composition 330A and the silicon-enriched developable antireflective composition 320A. Referring to FIG. 3G, the photoexposed photoresist regions 370A may, in one or more embodiments, be removed such that the crosslinked, underlying silicon-enriched developable antireflective material regions 380A remain on the substrate 310. The photoexposed photoresist regions 370A may be removed using an aqueous alkaline solution, such as a solution of TMAH, resulting in a pattern of crosslinked, underlying silicon-enriched developable antireflective material regions 380A on the substrate 310.

Figure 3H:
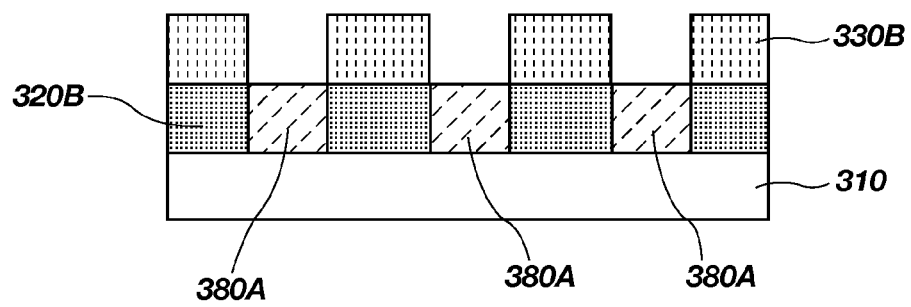

The pattern of crosslinked, underlying silicon-enriched developable antireflective material regions 380A on the substrate 310 may alternatively be formed by first removing photoexposed photoresist regions 370A (FIG. 3E) and then removing non-exposed positive-tone photoresist material 330B and the non-crosslinked silicon-enriched developable antireflective material 320B. Referring to FIG. 3H, the photoexposed photoresist regions 370A may be removed, such as by using an aqueous alkaline solution. The non-exposed positive-tone photoresist material 330B and the non-crosslinked silicon-enriched developable antireflective material 320B may then be removed using the second solvent that is selective for the materials relative to the crosslinked, underlying silicon-enriched developable antireflective material regions 380A, producing the same structure as shown in FIG. 3G. The solvent may be one of the solvents previously discussed. Removal of the non-exposed positive-tone photoresist material 330B and the non-crosslinked silicon-enriched developable antireflective material 320B may produce a pattern of crosslinked, underlying silicon-enriched developable antireflective material regions 380A on the substrate 310.

Figure 4A:
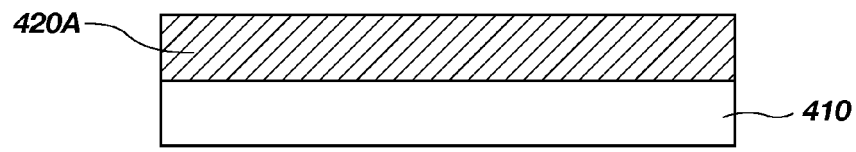
FIGS. 4A-4I are cross-sectional views of semiconductor device structures that illustrate the processing acts that may be employed in embodiments of the present disclosure to form a patterned, silicon-enriched, developable antireflective material on a substrate.

Yet other embodiments of the present disclosure will now be described with reference to FIGS. 4A through 4I, which illustrate additional semiconductor device structures that may be formed in the process of patterning the silicon-enriched developable antireflective material. Referring to FIG. 4A, the upper surface of a substrate 410 may be coated with a silicon-enriched developable antireflective composition 420A. The silicon-enriched developable antireflective composition 420A may be formed on the substrate 410 as described above. The substrate 410 and the silicon-enriched developable antireflective composition 420A may be substantially similar to the substrate 110 and the silicon-enriched developable antireflective composition 120A described above. The silicon-enriched developable antireflective composition 420A may include a crosslinking agent that is activated upon exposure to radiation and/or heat.

Figure 4B:
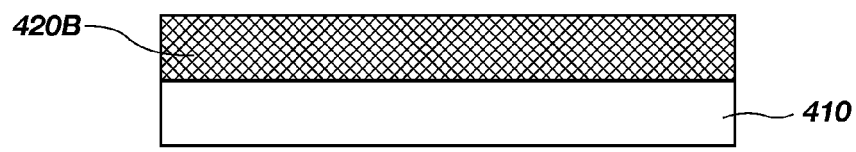

Referring next to FIG. 4B, the silicon-enriched developable antireflective composition 420A may be heated (i.e., soft baked) to remove any casting solvent and form a silicon-enriched developable antireflective material 420B on the substrate 410. The heating may take place on a hot plate or in an oven, as previously described. The heating of the silicon-enriched developable antireflective composition 420A may be conducted at a single temperature or at multiple temperatures. The heating may be conducted for an amount of time and at a temperature sufficient to remove the casting solvent but not initiate crosslinking of the silicon-enriched polymer and the crosslinking agent. The duration of the time and temperature may at least partially depend on the chosen method of heating and the components of the silicon-enriched developable antireflective composition 420A.

Figure 4C:
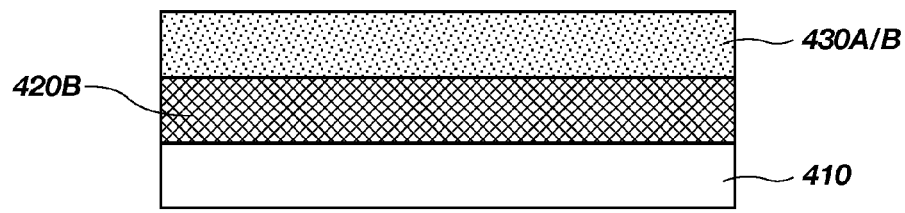

Referring next to FIG. 4C, a positive-tone photoresist composition 430A may be formed over the upper surface of the silicon-enriched developable antireflective material 420B. The positive-tone photoresist composition 430A may be formed over the silicon-enriched developable antireflective material 420B before crosslinking the silicon-enriched developable antireflective material 420B. Therefore, in this embodiment, the term "silicon-enriched developable antireflective material" refers to the silicon-enriched developable antireflective composition 420A that is soft baked but not crosslinked. The composition and method of applying the positive-tone photoresist composition 430A may be substantially similar to those previously described with respect to the positive-tone photoresist composition 130A. However, the casting solvent for the positive-tone photoresist composition 430A may be a solvent in which the silicon-enriched developable antireflective material 420B is not soluble (i.e., a nonsolvent). By way of example, the casting solvent for the positive-tone photoresist composition 430A may be an alcohol since PDMS is not soluble in an alcohol. The positive-tone photoresist composition 430A may be heated to remove the casting solvent and form a positive-tone photoresist material 430B. The heating of the positive-tone photoresist composition 430A may occur in a manner substantially similar to that described above for the positive-tone photoresist composition 130A. The silicon-enriched developable antireflective material 420B and positive-tone photoresist material 430B may form a bilayer film.

Figure 4D:
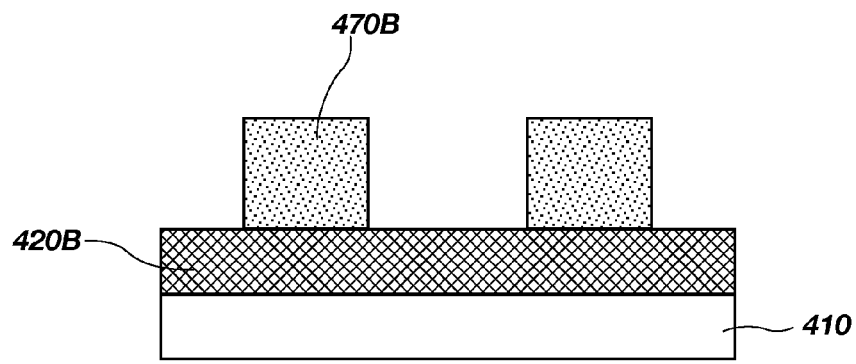

Referring to FIG. 4D, the positive-tone photoresist material 430B may be exposed to radiation and developed, producing positive-tone photoresist pattern 470B overlying the silicon-enriched developable antireflective material 420B. The positive-tone photoresist material 430B may be exposed to radiation (not shown) having a wavelength of less than or equal to about 248 nm (e.g., 248 nm, 193 nm, 157 nm, 126 nm, 13 nm), producing photoexposed photoresist regions (not shown) and remaining regions of the positive-tone photoresist material 430B that are not exposed to the radiation. The positive-tone photoresist material 430B may be exposed to radiation and subjected to a post-exposure bake in a manner substantially similar to that described above in regard to FIGS. 1D and 1E. The positive-tone photoresist material 430B may be exposed to the radiation through a mask (not shown), which is substantially similar to that disclosed above as mask 150. The exposure of the positive-tone photoresist material 430B may also be accomplished in through direct writing (i.e., without a mask). The photoexposed photoresist regions may be removed using a solvent, such as a positive-tone solvent or a negative-tone solvent in which the silicon-enriched developable antireflective material 420B and remaining regions of the positive-tone photoresist material 430B are insoluble. The solvent may be selective for the photoexposed photoresist regions relative to the silicon-enriched developable antireflective material 420B and remaining regions of the positive-tone photoresist material 430B. In other words, the solvent is a non-solvent for the silicon-enriched developable antireflective material 420B. Thus, the silicon-enriched developable antireflective material 420B and positive-tone photoresist pattern 470B may remain on the substrate 410. The solvent used to remove the photoexposed photoresist regions may be selected by a person of ordinary skill in the art depending on the material used as the positive-tone photoresist material 430B.

Figure 4E:
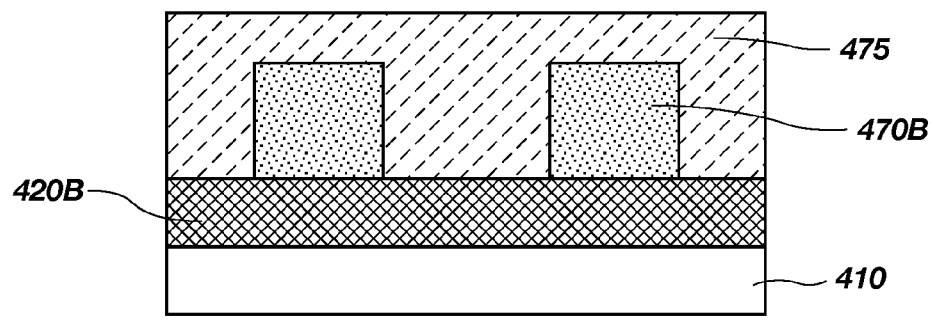
Figure 4F:
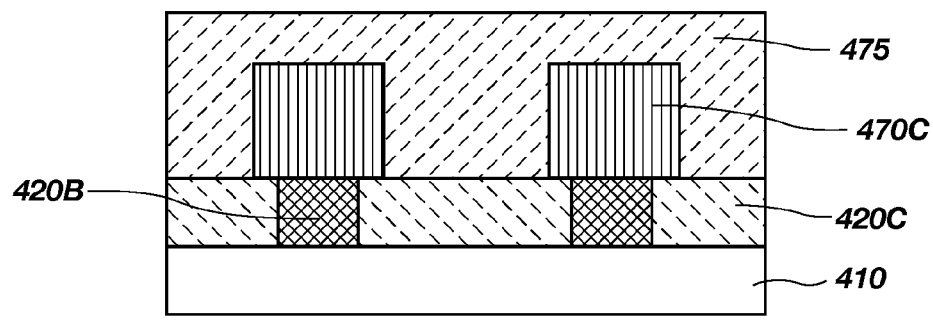

Referring to FIG. 4E, a freeze overcoat 475 may be formed over the positive-tone photoresist pattern 470B, such as by spin-coating. The freeze overcoat 475 may be used to make underlying materials insoluble (i.e., freeze the solubility of the positive-tone photoresist pattern 470B and portions of the silicon-enriched developable antireflective material 420B). Freeze overcoats are known in the art and, therefore, are not described in detail herein. The freeze overcoat 475 may be configured to crosslink portions of the silicon-enriched developable antireflective material 420B that come into contact with components of the freeze overcoat 475. The freeze overcoat 475 may also be configured to change the polarity of the positive-tone photoresist pattern 470B. The changes in polarity may result in changes in solubility of the positive-tone photoresist pattern 470B and the silicon-enriched developable antireflective material 420B. The freeze overcoat 475 may include an acid catalyst and, optionally, a crosslinking agent. The acid catalyst in the freeze overcoat may be one of the TAGs previously discussed. The crosslinking agent, if present, may be one of the crosslinking agents previously discussed. Referring to FIG. 4F, the freeze overcoat 475 may be exposed to heat (i.e., baked) such that the components of the freeze overcoat 475 diffuse into the positive-tone photoresist pattern 470B and into a portion of the silicon-enriched developable antireflective material 420B. The acid catalyst and crosslinking agent may diffuse isotropically into the positive-tone photoresist pattern 470B, causing its polarity to change and forming reversed-polarity positive-tone photoresist pattern 470C. The acid catalyst and crosslinking agent may also diffuse isotropically into portions of the silicon-enriched developable antireflective material 420B underlying the freeze overcoat 475, forming crosslinked silicon-enriched developable antireflective material 420C. The acid catalyst and crosslinking agent may diffuse vertically and laterally, causing the silicon-enriched developable antireflective material 420B to have different dimensions than the overlying reversed-polarity positive-tone photoresist pattern 470C. The crosslinking of the silicon-enriched developable antireflective material 420B may change the solubility of the material.

Figure 4G:
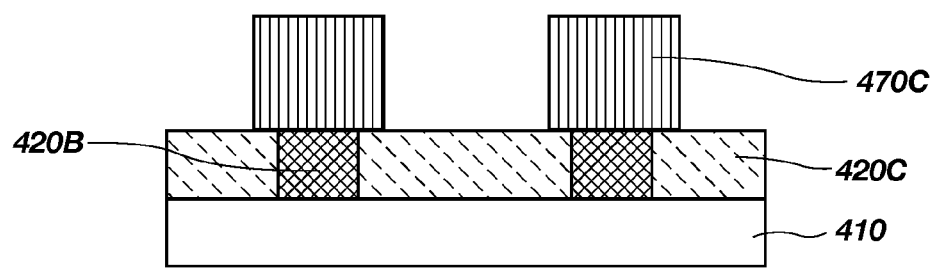
Figure 4H:
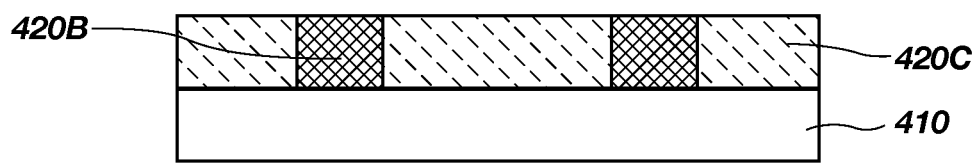
Figure 4I:
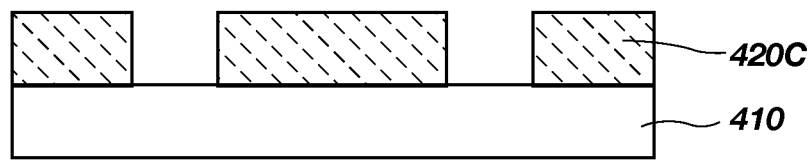

Referring to FIG. 4G, the freeze overcoat 475 may be removed using a solvent that is selective for the freeze overcoat 475 relative to the reversed-polarity positive-tone photoresist pattern 470C, the silicon-enriched developable antireflective material 420B, and the crosslinked silicon-enriched developable antireflective material 420C. Referring to FIG. 4H, the reversed-polarity positive-tone photoresist pattern 470C may be removed relative to the silicon-enriched developable antireflective material 420B and crosslinked silicon-enriched developable antireflective material 420C using a solvent that is selective for the reversed-polarity positive-tone photoresist pattern 470C. Referring to FIG. 4I, the silicon-enriched developable antireflective material 420B, which is not crosslinked, may be removed, forming a pattern of crosslinked silicon-enriched developable antireflective material 420C on the substrate 410. The silicon-enriched developable antireflective material 420B may be removed using a solvent that is selective for the silicon-enriched developable antireflective material 420B relative to the crosslinked silicon-enriched developable antireflective material 420C. The solvents used to remove the freeze overcoat 475, reversed-polarity positive-tone photoresist pattern 470C, and silicon-enriched developable antireflective material 420B may be selected by a person of ordinary skill in the art and, therefore, are not described in detail herein.

The semiconductor device structures shown in FIGS. 1A-4I may be intermediate semiconductor device structures formed during the fabrication of a DRAM structure or a NAND structure. The intermediate semiconductor device structures may be subjected to additional processing acts to form the DRAM structure or NAND structure.

CONCLUSION

An embodiment of the present disclosure includes a method of forming a patterned silicon-enriched, developable antireflective material. The method comprises forming a silicon-enriched, developable antireflective composition that comprises a silicon-enriched polymer and a crosslinking agent. The silicon-enriched polymer and the crosslinking agent are reacted to form a silicon-enriched, developable antireflective material that is insoluble and has at least one acid-sensitive moiety. A positive-tone photosensitive material is formed over the silicon-enriched, developable antireflective material and regions thereof are exposed to radiation. The exposed regions of the positive-tone photosensitive material and underlying regions of the silicon-enriched, developable antireflective material are removed.

Another embodiment of the present disclosure includes a method of forming a patterned silicon-enriched, developable antireflective material. The method comprises forming a silicon-enriched, developable antireflective composition that comprises a silicon-enriched polymer and a crosslinking agent. The silicon-enriched polymer and the crosslinking agent are reacted to form a silicon-enriched, developable antireflective material having at least one acid-sensitive moiety. A positive-tone photosensitive material is formed over the silicon-enriched, developable antireflective material and regions thereof are exposed to radiation. The exposed regions of the positive-tone photosensitive material and underlying regions of the silicon-enriched, developable antireflective material are removed.

Yet another embodiment of the present disclosure includes a method of forming a patterned silicon-enriched, developable antireflective material. The method comprises forming a silicon-enriched, developable antireflective composition that comprises a silicon-enriched polymer and a crosslinking agent having at least one acid-sensitive moiety. A positive-tone photosensitive material is formed over the silicon-enriched, developable antireflective composition and regions thereof are exposed to radiation. Regions of the silicon-enriched developable antireflective material underlying the exposed regions of the positive-tone photosensitive material are crosslinked. The non-exposed regions of the positive-tone photoresist and underlying regions of the silicon-enriched, developable antireflective material are removed.

Yet still another embodiment of the present disclosure includes a method of forming a patterned silicon-enriched, developable antireflective material. The method comprises forming a silicon-enriched, developable antireflective composition that comprises a silicon-enriched polymer and a crosslinking agent. A positive-tone photosensitive material is formed over the silicon-enriched, developable antireflective composition and regions thereof are exposed to radiation. Regions of the silicon-enriched developable antireflective material underlying the exposed regions of the positive-tone photosensitive material are crosslinked. The exposed regions of the positive-tone photosensitive material are subjected to an aqueous alkaline solution to remove the exposed regions of the positive-tone photosensitive material. Non-exposed regions of the positive-tone photoresist and underlying regions of the silicon-enriched, developable antireflective material are subjected to a solvent.

Yet still another embodiment of the present disclosure includes a semiconductor device structure comprising an insoluble, silicon-enriched, developable antireflective material disposed on a material. The insoluble, silicon-enriched, developable antireflective material comprises at least about 17% by weight of silicon, and comprises a crosslinked organo-silicate polymer, a crosslinked organo-siloxane polymer, or a crosslinked organo-silsesquioxane polymer with at least two acid-sensitive moieties that are configured to react in the presence of an acid to produce a soluble material. A photosensitive material is disposed over the insoluble, silicon-enriched, developable antireflective material.

Yet still another embodiment of the present disclosure includes a method of forming a patterned silicon-enriched, developable antireflective material. The method comprises fanning a silicon-enriched, developable antireflective composition that comprises a silicon-enriched polymer and a crosslinking agent. The silicon-enriched, developable antireflective composition is exposed to heat to form a silicon-enriched, developable antireflective material. A positive-tone photosensitive material is formed over the silicon-enriched, developable antireflective material and exposed to heat to form a positive-tone photosensitive material. Regions of the positive-tone photosensitive material are exposed to radiation. The exposed regions of the positive-tone photosensitive material are removed to expose underlying regions of the silicon-enriched, developable antireflective material. A freeze overcoat is formed over the non-exposed regions of the positive-tone photosensitive material and the underlying regions of the silicon-enriched developable antireflective material. The exposed regions of the silicon-enriched, developable antireflective material are crosslinked. The freeze overcoat, non-exposed regions of the positive-tone photosensitive material, and non-crosslinked regions of the silicon-enriched, developable antireflective material are removed.

While the disclosure is susceptible to various modifications and alternative forms, specific embodiments have been shown by way of example in the drawings and have been described in detail herein. However, the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method of forming a patterned, silicon-enriched developable antireflective material, comprising:
    forming a silicon-enriched developable antireflective composition soluble in a solvent and comprising a silicon-enriched polymer and a crosslinking agent;
    reacting the silicon-enriched polymer and the crosslinking agent to form a silicon-enriched developable antireflective material insoluble in the solvent;
    forming a positive-tone photosensitive material over the silicon-enriched developable antireflective material;
    exposing regions of the positive-tone photosensitive material to radiation to decouple underlying regions of the silicon-enriched developable antireflective material and render the underlying regions of the silicon-enriched developable antireflective material soluble in the solvent; and
    removing the exposed regions of the positive-tone photosensitive material and the underlying regions of the silicon-enriched developable antireflective material.

2. The method of claim 1, wherein the silicon-enriched polymer comprises a water-soluble polymer.

3. The method of claim 1, wherein the silicon-enriched polymer comprises an organo-silicate compound, an organo-siloxane compound, or an organo-silsesquioxane compound.

4. The method of claim 1, wherein the silicon-enriched developable antireflective composition further comprises a thermal acid generator.

5. The method of claim 1, wherein the silicon-enriched developable antireflective composition further comprises a thermal acid generator and a photoacid generator.

6. The method of claim 1, wherein the positive-tone photosensitive material further comprises a photoacid generator.

7. The method of claim 1, wherein the silicon-enriched developable antireflective composition further comprises a decoupling agent.

8. The method of claim 1, wherein removing the exposed regions of the positive-tone photosensitive material and the underlying regions of the silicon-enriched developable antireflective material comprises removing the exposed regions of the positive-tone photosensitive material and the underlying regions of the silicon-enriched developable antireflective material in a single act.

9. The method of claim 1, wherein removing the exposed regions of the positive-tone photosensitive material and the underlying regions of the silicon-enriched developable antireflective material comprises:
    removing the exposed regions of the positive-tone photosensitive material using a first solvent; and
    removing the underlying regions of the silicon-enriched developable antireflective material using a second solvent.

10. The method of claim 1, wherein reacting the silicon-enriched polymer and the crosslinking agent comprises reacting the silicon-enriched polymer and the crosslinking agent in the presence of at least one of heat and radiation to form the silicon-enriched developable antireflective material, silicon comprising at least about 17% of a total weight of the silicon-enriched developable antireflective material.

11. The method of claim 1, wherein exposing regions of the positive-tone photosensitive material to radiation comprises exposing the positive-tone photosensitive material to radiation through an imaging device.

12. The method of claim 1, wherein exposing regions of the positive-tone photosensitive material to radiation to decouple underlying regions of the silicon-enriched developable antireflective material comprises diffusing acid from the exposed regions of the positive-tone photosensitive material into the underlying regions of the silicon-enriched developable antireflective material.

13. The method of claim 1, wherein removing the exposed regions of the positive-tone photosensitive material and the underlying regions of the silicon-enriched developable antireflective material comprises simultaneously removing the exposed regions of the positive-tone photosensitive material and the underlying regions of the silicon-enriched developable antireflective material using the solvent.

14. The method of claim 1, wherein removing the exposed regions of the positive-tone photosensitive material and the underlying regions of the silicon-enriched developable antireflective material comprises simultaneously removing the exposed regions of the positive-tone photosensitive material and the exposed regions of the silicon-enriched developable antireflective material using an aqueous alkaline solution.

15. The method of claim 1, wherein reacting the silicon-enriched polymer and the crosslinking agent comprises exposing the silicon-enriched polymer and the crosslinking agent to an acid, and wherein exposing regions of the positive-tone photosensitive material to radiation to decouple underlying regions of the silicon-enriched developable antireflective material comprises exposing the underlying regions of the silicon-enriched developable antireflective material to a different acid.

16. The method of claim 15, wherein exposing the silicon-enriched polymer and the crosslinking agent to an acid comprises generating the acid from a thermal acid generator, and wherein exposing the underlying regions of the silicon-enriched developable antireflective material to a different acid comprises generating the different acid from a photoacid generator.

17. The method of claim 15, wherein the acid comprises a weaker acid than the different acid.

18. A method of forming a patterned, silicon-enriched developable antireflective coating comprising:
    forming a silicon-enriched developable antireflective composition comprising:
        a silicon-enriched polymer formulated to be soluble in water; and
        a crosslinking agent formulated to react with at least one moiety of the silicon-enriched polymer;
    reacting the silicon-enriched polymer and the crosslinking agent to form a silicon-enriched developable antireflective material insoluble in water and having at least one acid-sensitive moiety;
    forming a positive-tone photosensitive material over the silicon-enriched developable antireflective material;
    exposing regions of the positive-tone photosensitive material to radiation to render the exposed regions of the positive-tone photosensitive material and underlying regions of the silicon-enriched developable antireflective material soluble in at least one aqueous alkaline solution; and
    removing the exposed regions of the positive-tone photosensitive material and the underlying regions of the silicon-enriched developable antireflective material using the at least one aqueous alkaline solution.

19. The method of claim 18, wherein the silicon-enriched polymer comprises a silicon content of at least about 17% by weight of the silicon-enriched polymer.

20. The method of claim 18, wherein the silicon-enriched polymer comprises a modified poly(dimethylsiloxane) comprising at least two hydroxyl-terminated oligo(ethylene oxide) moieties grafted on poly(dimethylsiloxane).

21. The method of claim 18, wherein removing the exposed regions of the positive-tone photosensitive material and the underlying regions of the silicon-enriched developable antireflective material using the at least one aqueous alkaline solution comprises removing the exposed regions of the positive-tone photosensitive material and the underlying regions of the silicon-enriched developable antireflective material using aqueous tetramethylammonium hydroxide.

22. The method of claim 18, further comprising removing regions of the positive-tone photosensitive material not exposed to the radiation.

23. A method of forming a patterned, silicon-enriched antireflective material comprising:
    forming a silicon-enriched developable antireflective material comprising a silicon-enriched polymer and a crosslinking agent; and
    forming a positive-tone photosensitive material over the silicon-enriched developable antireflective material prior to crosslinking the silicon-enriched developable antireflective material;
    exposing regions of the positive-tone photosensitive material to radiation to crosslink regions of the silicon-enriched developable antireflective material underlying the exposed regions of the positive-tone photosensitive material; and
    removing non-exposed regions of the positive-tone photosensitive material and other regions of the silicon-enriched developable antireflective material underlying the non-exposed regions of the positive-tone photosensitive material.

24. The method of claim 23, wherein removing non-exposed regions of the positive-tone photosensitive material and other regions of the silicon-enriched developable antireflective material underlying the non-exposed regions of the positive-tone photosensitive material comprises substantially simultaneously removing the non-exposed regions of the positive-tone photosensitive material and the underlying regions of the silicon-enriched developable antireflective material using a solvent.

25. A method of forming a patterned, silicon-enriched antireflective coating comprising:
    forming a silicon-enriched developable antireflective material comprising a silicon-enriched polymer and a crosslinking agent; and
    forming a positive-tone photosensitive material over the silicon-enriched developable antireflective material prior to crosslinking the silicon-enriched developable antireflective material;
    exposing regions of the positive-tone photosensitive material to radiation to crosslink underlying regions of the silicon-enriched developable antireflective material;
    removing the exposed regions of the positive-tone photosensitive material using a first solvent comprising an aqueous alkaline solution; and
    removing non-exposed regions of the positive-tone photosensitive material and regions of the silicon-enriched developable antireflective material under the non-exposed regions of the positive-tone photosensitive material using a second solvent.

26. The method of claim 25, wherein exposing regions of the positive-tone photosensitive material to radiation to crosslink underlying regions of the silicon-enriched developable antireflective material comprises diffusing acid from the exposed regions of the positive-tone photosensitive material into the underlying regions of the silicon-enriched developable antireflective material.

27. A method of forming a patterned, silicon-enriched antireflective coating comprising:
    forming a silicon-enriched developable antireflective composition on a material, the silicon-enriched developable antireflective composition comprising a silicon-enriched polymer and a crosslinking agent;
    exposing the silicon-enriched developable antireflective composition to heat to form a silicon-enriched developable antireflective material;
    forming a positive-tone photosensitive composition over the silicon-enriched developable antireflective material;
    exposing the positive-tone photosensitive composition to heat to form a positive-tone photosensitive material;
    exposing regions of the positive-tone photosensitive material to radiation;
    removing the exposed regions of the positive-tone photosensitive material to expose underlying regions of the silicon-enriched developable antireflective material;
    forming a freeze overcoat over the non-exposed regions of the positive-tone photosensitive material and the underlying regions of the silicon-enriched developable antireflective material;
    crosslinking the exposed regions of the silicon-enriched developable antireflective material; and
    removing the freeze overcoat, the non-exposed regions of the positive-tone photosensitive material and non-crosslinked regions of the silicon-enriched developable antireflective material.

28. The method of claim 27, wherein exposing the silicon-enriched developable antireflective composition to heat to form a silicon-enriched developable antireflective material comprises exposing the silicon-enriched developable antireflective composition to a temperature sufficient to remove a casting solvent but not crosslink the silicon-enriched polymer.

29. The method of claim 27, wherein forming a positive-tone photosensitive composition over the silicon-enriched developable antireflective material comprises forming the positive-tone photosensitive composition before crosslinking the silicon-enriched developable antireflective composition.

30. The method of claim 27, wherein forming a positive-tone photosensitive composition over the silicon-enriched developable antireflective material comprises forming the positive-tone photosensitive composition in a solvent in which the silicon-enriched developable antireflective material is insoluble.

31. The method of claim 27, wherein crosslinking the exposed regions of the silicon-enriched developable antireflective material comprises diffusing an acid catalyst from the freeze overcoat into the exposed regions of the silicon-enriched developable antireflective material.

\* \* \* \* \*